(12) United States Patent
Yang et al.

(10) Patent No.: US 10,983,258 B2
(45) Date of Patent: Apr. 20, 2021

(54) COLOR FILTER SUBSTRATE, METHOD FOR FABRICATING THE SAME, AND DISPLAY DEVICE

(71) Applicant: BOE Technology Group Co., Ltd., Beijing (CN)

(72) Inventors: Song Yang, Beijing (CN); Ge Shi, Beijing (CN); Ming Zhu, Beijing (CN); Shiyu Zhang, Beijing (CN); Zheng Fang, Beijing (CN); Haijun Niu, Beijing (CN); Yujie Liu, Beijing (CN); Jiahui Han, Beijing (CN); Yuyao Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 44 days.

(21) Appl. No.: 16/448,096

(22) Filed: Jun. 21, 2019

(65) Prior Publication Data

US 2020/0088921 A1 Mar. 19, 2020

(30) Foreign Application Priority Data

Sep. 17, 2018 (CN) .......................... 201811081800.5

(51) Int. Cl.
*G02B 5/20* (2006.01)
*G02B 5/26* (2006.01)
(Continued)

(52) U.S. Cl.
CPC .............. *G02B 5/201* (2013.01); *G02B 5/26* (2013.01); *G03F 7/0007* (2013.01); *G02F 1/1362* (2013.01); *G02F 1/136222* (2021.01)

(58) Field of Classification Search
CPC ....... G03F 7/0007; G02B 5/201; G02B 5/223; G02B 5/26; G02F 1/133514;
(Continued)

(56) References Cited

U.S. PATENT DOCUMENTS 6,259,499 B1 * 7/2001 Yamanashi .......... G02B 5/0215
349/113
2002/0015122 A1 2/2002 Yamanashi
(Continued)

FOREIGN PATENT DOCUMENTS

CN 1969206 A 5/2007
CN 103185981 A 7/2013
(Continued)

OTHER PUBLICATIONS

Chinese Office Action for corresponding application 201811081800.5 dated Nov. 2, 2020.

*Primary Examiner* — John A McPherson
(74) *Attorney, Agent, or Firm* — Arent Fox LLP; Michael Fainberg

(57) ABSTRACT

Disclosed are a color filter substrate, a method for fabricating the same, and a display device. The color filter substrate includes a plurality of color-resist elements, and the color filter substrate further includes: a base substrate, and a groove arranged on the base substrate in correspondence to each of the color-resist elements, wherein a size of an opening of each groove is increase from the bottom to the top, a reflecting layer is coated on an inner surface of the groove, and a color-resist filler corresponding to a color of light emitted by the color-resist element is further filled in the groove above the reflecting layer.

18 Claims, 7 Drawing Sheets

(51) Int. Cl.
*G03F 7/00* (2006.01)
*G02F 1/1362* (2006.01)

(58) Field of Classification Search
CPC ......... G02F 1/133516; G02F 1/133555; G02F 2001/133557
USPC .............................................. 430/7; 349/106
See application file for complete search history.

(56) References Cited

U.S. PATENT DOCUMENTS

| | | | |
|---|---|---|---|
| 2003/0147030 A1* | 8/2003 | Sone | G02F 1/133555 349/113 |
| 2008/0231960 A1 | 9/2008 | Van Gorkom et al. | |
| 2015/0253473 A1 | 9/2015 | Liu et al. | |

FOREIGN PATENT DOCUMENTS

| | | |
|---|---|---|
| CN | 108107627 A | 6/2018 |
| JP | 1195213 A | 4/1999 |
| JP | 2000111725 A | 4/2000 |
| JP | 2004318000 A | 11/2004 |
| TW | 448335 B | 8/2001 |

* cited by examiner

COLOR FILTER SUBSTRATE, METHOD FOR FABRICATING THE SAME, AND DISPLAY DEVICE

CROSS-REFERENCE TO RELATED APPLICATION

This application claims priority of Chinese Patent Application No. 2018/11081800.5, filed on Sep. 17, 2018, which is hereby incorporated by reference in its entirety.

FIELD

The present disclosure relates to the field of semiconductor technologies, and particularly to a color filter substrate, a method for fabricating the same, and a display device.

BACKGROUND

A Flat Panel Display (FPD) has become predominant in the market, and there are more and more types of flat panel displays, e.g., a Liquid Crystal Display (LCD), an Organic Light-Emitting Diode (OLED) display, a Plasma Display Panel (PDP), a Field Emission Display (FED), etc.

SUMMARY

Some embodiments of the disclosure provide color filter substrate including a plurality of color-resist elements, wherein the color filter substrate further includes: a base substrate, and a groove arranged on the base substrate in correspondence to each of the color-resist elements, wherein a size of an opening of the groove gradually increases from a bottom to a top of the groove, a reflecting layer is coated on an inner surface of the groove, and a color-resist filler corresponding to a color of light emitted by the color-resist element is further filled in the groove above the reflecting layer.

In a possible implementation, a plurality of grooves are arranged on the base substrate in correspondence to each of the color-resist elements, and color-resist fillers filled in the plurality of grooves corresponding to a same color-resist element are same.

In a possible implementation, the plurality of grooves are arranged in an array, and a section shape of each of the plurality of grooves is an inverted tri-pyramid, quadric-pyramid or cone.

In a possible implementation, each of the plurality of grooves is shaped like a strip, and the grooves are arranged in parallel.

In a possible implementation, the color-resist elements are arranged in an array, a same row of color-resist elements emits light in same color, and a group of grooves are arranged on the base substrate in correspondence to each row of color-resist elements, wherein each group of grooves comprises a plurality of strip grooves extending in a row direction of corresponding color-resist elements, and color-resist fillers filled in the plurality of strip grooves corresponding to a same row of color-resist elements are same.

In a possible implementation, the color-resist elements are arranged in an array, a same column of color-resist elements emits light in same color, and a group of grooves are arranged on the base substrate in correspondence to each column of color-resist elements, wherein each group of grooves comprises a plurality of strip grooves extending in a column direction of corresponding color-resist elements, and color-resist fillers filled in the plurality of strip grooves corresponding to a same column of color-resist elements are same.

In a possible implementation, the color-resist elements are arranged in an array, a same row of color-resist elements emits light in same color, and a groove is arranged on the base substrate in correspondence to a same row of color-resist elements.

In a possible implementation, a same column of color-resist elements emits light in a same color, and a groove is arranged on the base substrate in correspondence to a same column of color-resist elements.

In a possible implementation, a material of the color-resist filler includes quantum dot particles.

In a possible implementation, a transmittivity of the reflecting layer to blue light ranges from 69% to 78%.

In a possible implementation, the reflecting layer is a silver film with a thickness ranging from 5 nm to 15 nm.

Some embodiments of the disclosure further provide a display device including an array substrate, and the color filter substrate according to any one of the implementations above of the disclosure, wherein a side provided with the groove, of the color filter is away from the array substrate.

DETAILED DESCRIPTION OF THE EMBODIMENTS

In order to make the objects, technical solutions, and advantages of the disclosure more apparent, the technical solutions according to the embodiments of the disclosure will be described below clearly and fully with reference to the drawings in the embodiments of the disclosure. Apparently the embodiments to be described are only a part but all of the embodiments of the disclosure. Based upon the embodiments here of the disclosure, all of other embodiments which can occur to those ordinarily skilled in the art without any inventive effort shall come into the scope of the disclosure as claimed.

Unless defined otherwise, technical terms or scientific terms throughout this disclosure shall convey their usual meaning as appreciated by those ordinarily skilled in the art to which this disclosure pertains. The terms "first", "second", or the like throughout this disclosure do not suggest any order, number or significance, but is only intended to distinguish different components from each other. Alike the terms "include", "comprise", or the like refer to that an element or an item preceding to the term encompasses an element(s) or an item(s) succeeding to the term, and its (or their) equivalence(s), but shall not preclude another element (s) or item(s). The term "connect", "connected", or the like does not suggest physical or mechanical connection, but may include electrical connection no matter whether it is direct or indirect. The terms "above", "below", "left", "right", etc., are only intended to represent a relative positional relationship, and when the absolute position of an object as described is changed, the relative positional relationship may also be changed accordingly.

For the sake of clarity and conciseness of the following description of the embodiments of this disclosure, a detailed description of known functions and components will be omitted in this disclosure.

Figure 1:
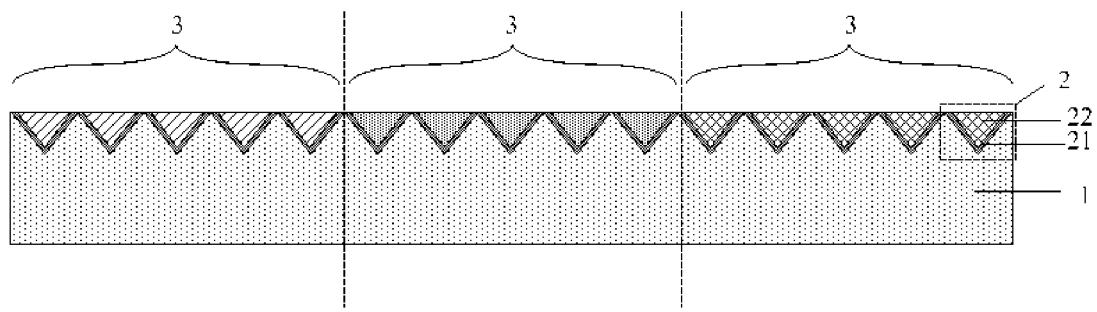
FIG. 1 is a schematic structural diagram of a color filter substrate according to some embodiments of the disclosure in a sectional view.

Referring to FIG. 1, some embodiments of the disclosure provide a color filter substrate including a plurality of color-resist elements 3, where the color filter substrate further includes: a base substrate 1, and grooves 2 arranged on the base substrate 1 in correspondence to the respective color-resist elements 3, where the size of an opening of each groove 2 is increased from the bottom to the top, a reflecting layer 21 is coated on the inner surface of the groove 2, and a color-resist filler 22 corresponding to a color of light emitted by the color-resist element is further filled in the groove 2 above the reflecting layer 21, that is, a color-resist filler for emitting red light upon being excited by preset light is filled in a red pixel element, a color-resist filler for emitting green light upon being excited by preset light is filled in a green pixel element, and a color-resist filler for emitting blue light upon being excited by preset light is filled in a blue pixel element; and of course, if the exciting light is blue light, a color-resist filler through which blue light can be transmitted may alternatively be filled in the blue pixel element.

In the color filter substrate according to some embodiments of the disclosure, the grooves 2 are arranged on the base substrate 1 in correspondence to the respective color-resist elements 3; the color-resist fillers 22 are further filled in the grooves 2 above the reflecting layer 21 so that a color-resist layer can be formed; the sizes of the openings of the grooves 2 is increase from the bottom to the top, for example, the openings are V-shaped; and the reflecting layer 21 is coated on the inner surfaces of the grooves 2 so that the light emitted by each color-resist element can be emitted to one side of a display face to thereby avoid a color mixture between the adjacent pixel elements so as to improve the color gamut.

In a particular implementation, the base substrate 1 in some embodiments of the disclosure can be a transparent base substrate, and optionally can be a glass substrate. The color-resist elements 3 in some embodiments of the disclosure can include red color-resist elements, green color-resist elements, and blue color-resist elements, and can be made of traditional resin, or can be generally made of a quantum dot material. For example, when the color filter substrate is applied to a liquid crystal display device, a backlight source of the display device is blue light, the color-resist elements include red color-resist elements for emitting red light upon being excited by the blue light, green color-resist element for emitting green light upon being excited by the blue light, and blue color-resist elements through which the blue light is transmitted, and different color-resist fillers are filled in the different color-resist elements. In the color filter substrate according to some embodiments of the disclosure, both the blue light emitted by the blue color-resist elements, and the blue light which is not absorbed by the red color-resist elements or the green color-resist elements can be emitted toward the display face, so no light will be emitted by the adjacent color-resist elements as a result of improper excitation to thereby alleviate a color mixture so as to prevent a color mixture between the pixel elements.

In a particular implementation, the grooves 2 in some embodiments of the disclosure can be arranged in a number of implementations, where a color-resist element 3 can be arranged corresponding to one or more grooves 2, and when a color-resist element 3 corresponds to a plurality of grooves 2, the respective grooves 2 can be shaped like a block, and for example, their cross sections perpendicular to the base substrate can be V-shaped; and for example, the shape of the grooves 2 can be a tri-pyramid, quadric-pyramid or a cone, and the plurality of block grooves 2 can be arranged in an array. Alternatively the respective grooves can be shaped like a strip, and for example, their cross sections in their extension direction can be V-shaped; and the plurality of strip grooves 2 are arranged in parallel, and the extension length of each strip groove 2 is the same as the length of the color-resist element 3. When light in the same color is emitted by the same row or column of color-resist elements 3, a row or column of color-resist elements can be arranged corresponding to a group of grooves, where each group of grooves includes a plurality of strip grooves 2 extending the row or column direction of the color-resist elements 3. Of course, a row or column of color-resist elements 3 can be arranged corresponding to only one groove 2 extending in the row or column direction of the color-resist elements 3. Particular examples thereof will be described below in details.

Figure 2:
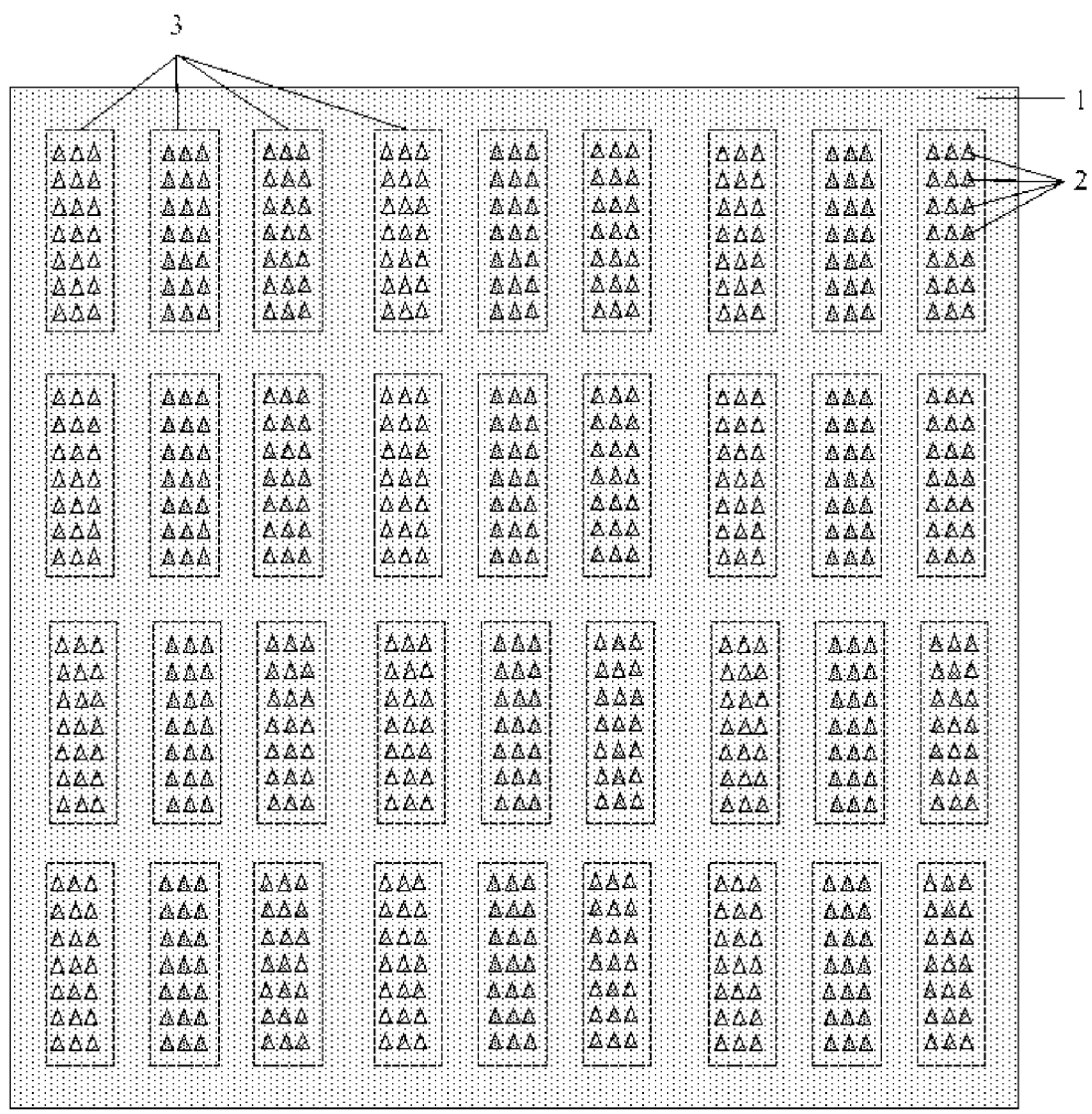
FIG. 2 is a schematic structural diagram of the color filter substrate according to some embodiments of the disclosure, in which a color-resist element corresponds to a plurality of block grooves, in a top view.

As illustrated in FIG. 2, for example, a plurality of grooves 2 are arranged in array on the base substrate 1 in correspondence to the respective color-resist elements 3 (FIG. 2 only illustrates each color-resist element 3 arranged corresponding to grooves in seven rows by three columns by way of an example, although some embodiments of the disclosure will not be limited thereto). The same color-resist filler is filled in the respective grooves 2 corresponding to the same color-resist element 3, and the color-resist filler can be quantum dot particles. For example, the color-resist elements 3 include red color-resist elements for emitting red light upon being excited by blue light, green color-resist element for emitting green light upon being excited by blue light, and blue color-resist elements through which blue light is transmitted, so quantum dot particles for emitting red light upon being excited by blue light can be filled in the respective grooves 2 corresponding to the red color-resist elements, quantum dot particles for emitting green light upon being excited by blue light can be filled in the respective grooves 2 corresponding to the green color-resist elements, and quantum dot particles through which blue light is transmitted can be filled in the respective grooves 2 corresponding to the blue color-resist elements. Since the length of a pixel element is roughly 72 micrometers, and the length of a color-resist element corresponding thereto is also 72 micrometers, so the width of each groove 2 in a row of grooves 2 corresponding to a color-resist element 3 can be set to 720 nanometers, and the number of grooves in a row can be set to 100. In some embodiments of the disclosure, each color-resist element 3 is arranged corresponding to a plurality of grooves 2 so that the probability that transversally transmitted light (i.e., light emitted by the current pixel element to an adjacent pixel element) comes into contact with a groove wall can be improved to thereby lower the intensity of the transversally transmitted light so as to avoid a color mixture from occurring. When a color-resist element 3 is arranged corresponding to a plurality of grooves 2, the shape of the respective grooves 2 is an inverted tri-pyramid, quadric-pyramid or cone so that each groove 2 can converge light rays to enable the light to be emitted toward the display face, thus avoiding a light mixture.

Figure 3:
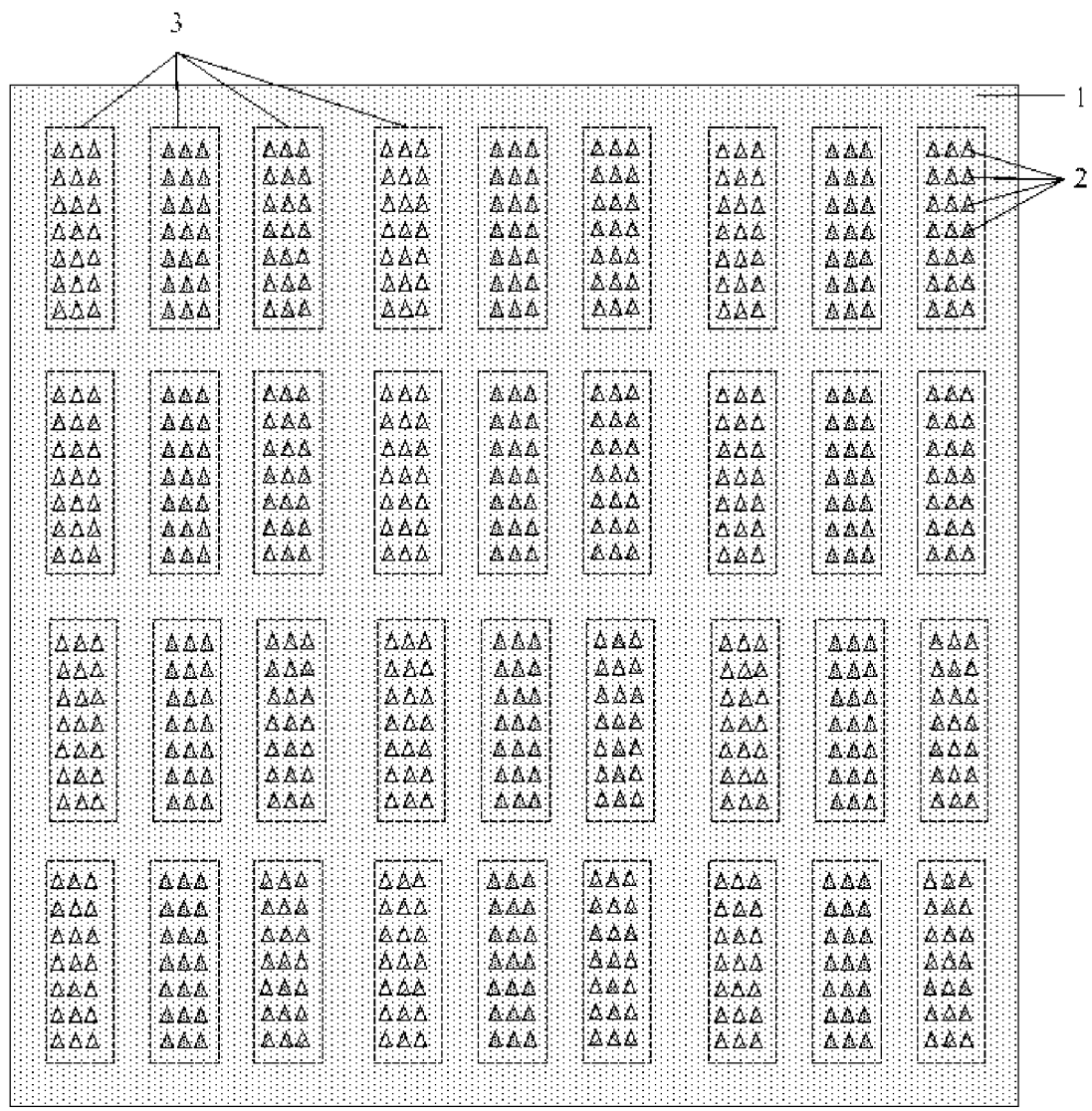
FIG. 3 is a schematic structural diagram of the color filter substrate according to some embodiments of the disclosure, in which a color-resist element corresponds to a plurality of strip grooves, in a top view.

In another example, as illustrated in FIG. 3, a plurality of grooves 2 are arranged on the base substrate 1 in correspondence to each color-resist element 3, where each groove 2 is shaped like a strip, and the plurality of grooves 2 are arranged in parallel. If each color-resist element 3 is shaped like a strip, the extension length of each groove 2 will be the same as the length of a longer side of the color-resist element 3. A color-resist filler made of the same material is filled in the plurality of grooves 2 corresponding to the same color-resist element 3.

Figure 4:
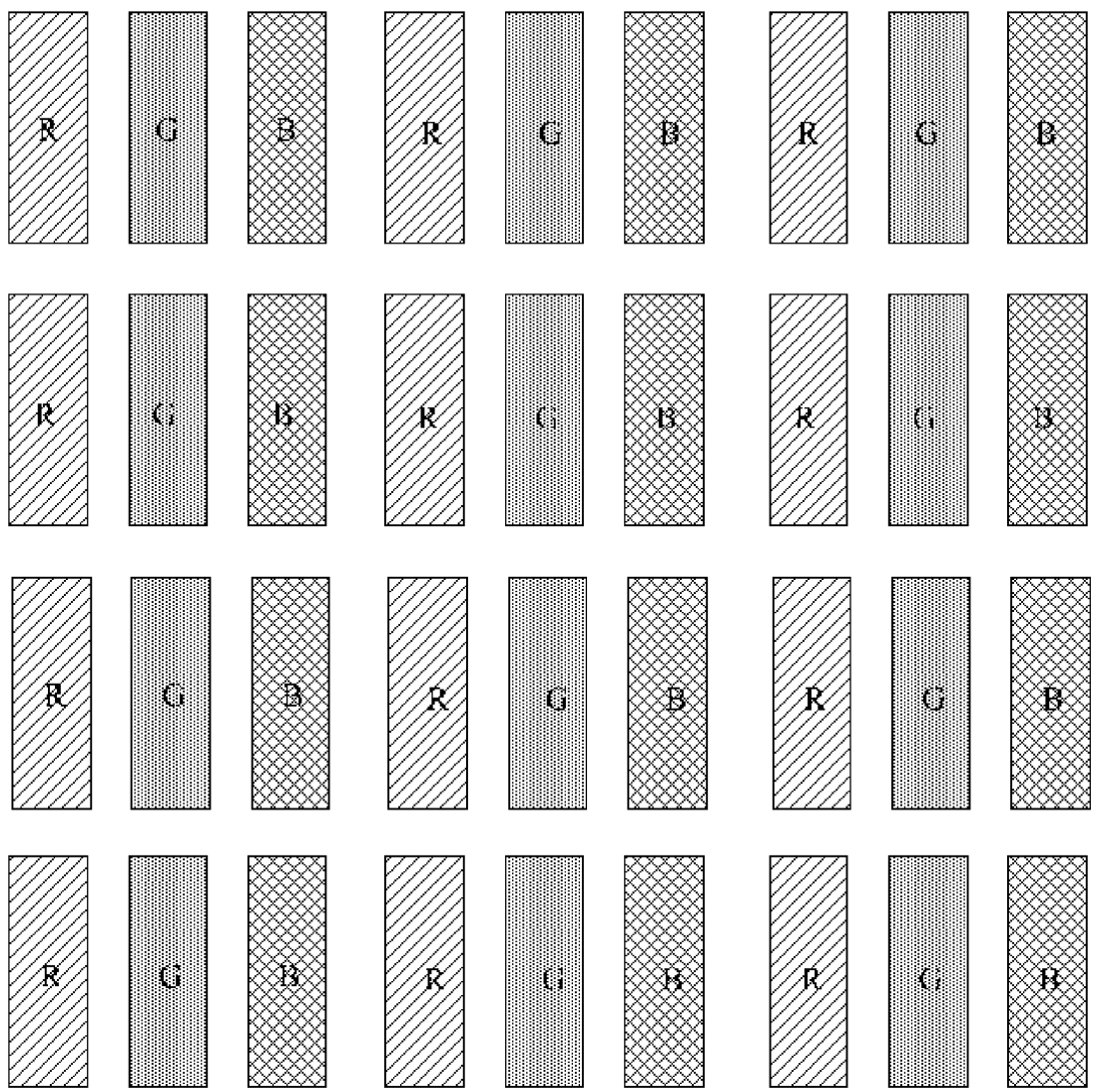
FIG. 4 is a schematic structural diagram of an arrangement of color-resist elements according to some embodiments of the disclosure.
Figure 5:
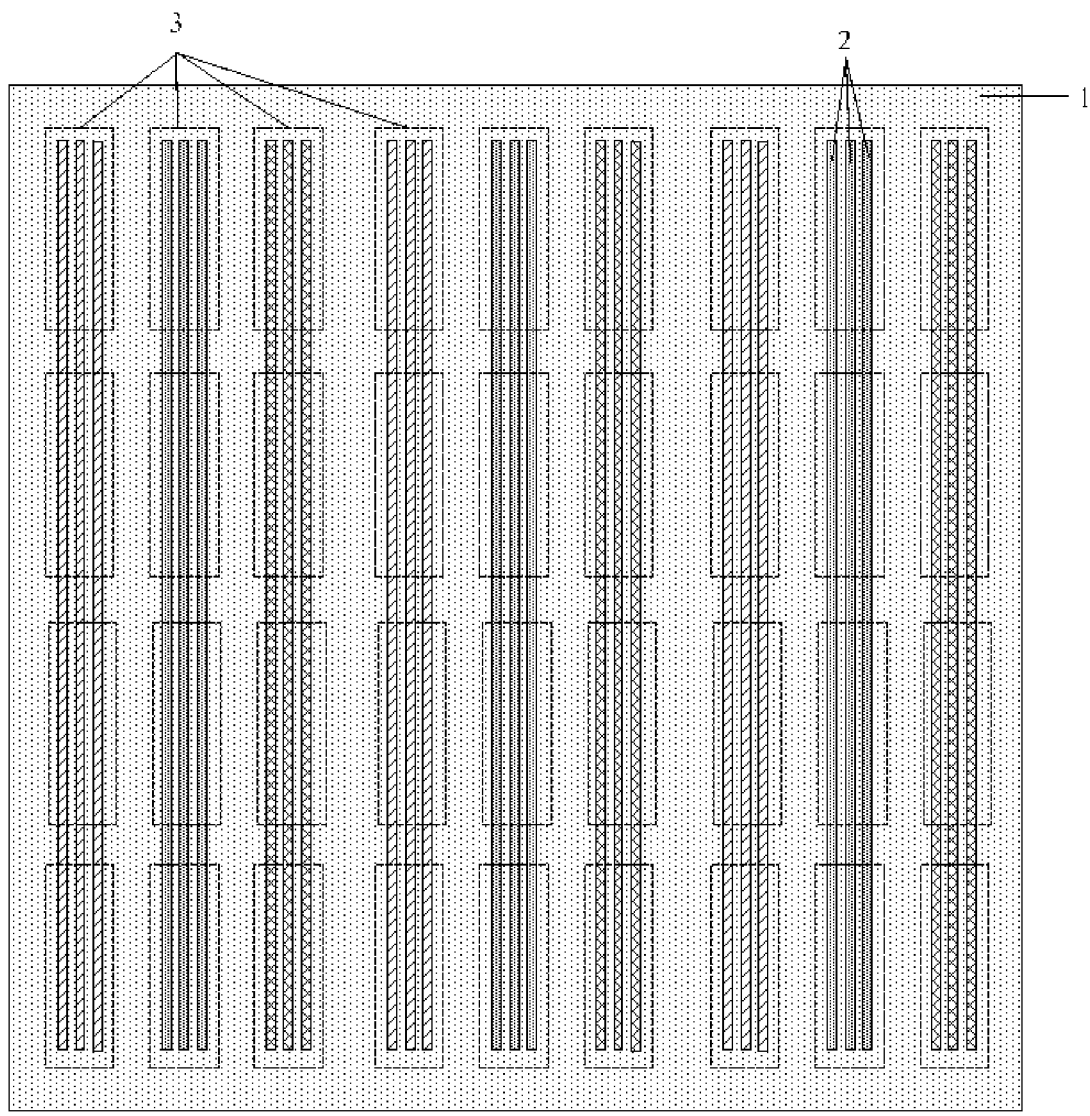
FIG. 5 is a schematic structural diagram of the color filter substrate according to some embodiments of the disclosure, in which a column of color-resist elements corresponds to a group of grooves, in a top view.

In another example, when the color-resist elements 3 are arranged in an array, and the same row or column of color-resist elements 3 emit light in the same color, a group of grooves are arranged on the base substrate 1 in correspondence to each row or column of color-resist elements 3, where each group of grooves includes a plurality of strip grooves 2 extending in the row or column direction of the corresponding color-resist elements 3, and the same color-resist filler is filled in the respective grooves 2 in each group of grooves. As illustrated in FIG. 4, for example, the same column of color-resist elements 3 emit light in the same color, so as illustrated in FIG. 5, a group of grooves can be arranged on the base substrate 1 in correspondence to a column of color-resist elements, where each group of grooves includes a plurality of strip grooves 2 extending in the column direction of the color-resist elements 3, and the same color-resist filler is filled in the respective grooves corresponding to the same column of color-resist elements.

Figure 6:
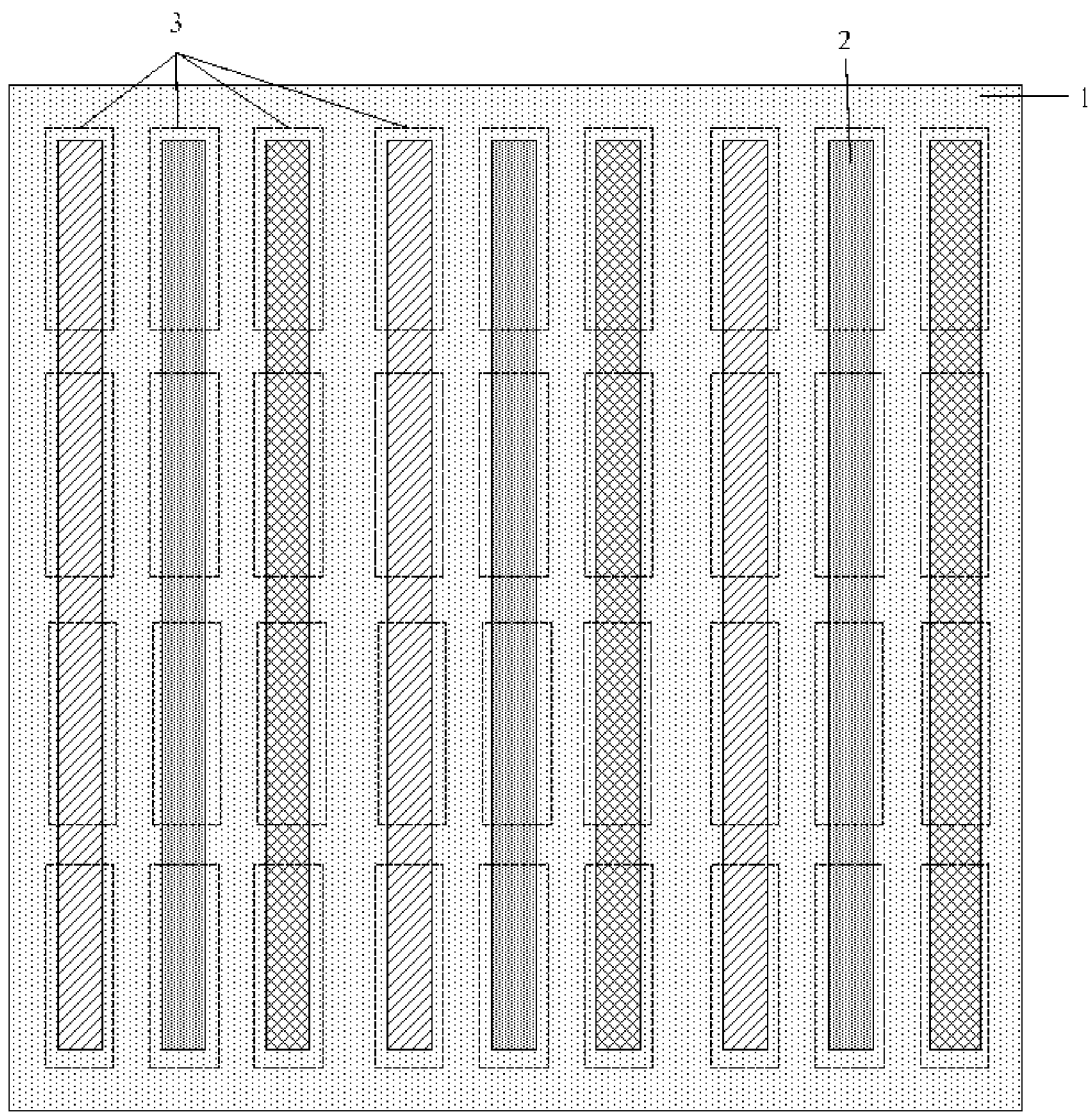
FIG. 6 is a schematic structural diagram of the color filter substrate according to some embodiments of the disclosure, in which a column of color-resist elements corresponds to a groove, in a top view.

In another example, when the color-resist elements 3 are arranged in an array, and the same row or column of color-resist elements 3 emit light in the same color, and a groove 2 is arranged on the base substrate 1 in correspondence to the same row or column of color-resist elements 3. Still as illustrated in FIG. 4, for example, the same column of color-resist elements 3 emit light in the same color, so in a particular arrangement of the grooves, as illustrated in FIG. 6, a groove 2 can be arranged on the base substrate 1 in correspondence to a column of color-resist elements 3. When a groove 2 is arranged corresponding to a row or column of color-resist elements 3, the fabrication process can be simplified.

In a possible implementation, the material of a color-resist filler 2 includes quantum dot particles. Since the color-resist filer made of quantum dot particles do not tend to bring a color mixture between adjacent pixel elements, a color mixture between adjacent pixel elements can be alleviated in effect in the color filter according to some embodiments of the disclosure including the color-resist elements corresponding to the grooves filed with the color-resist fillers including the quantum dot particles.

In a possible implementation, the transmittivity of the reflecting layer to blue light ranges from 69% to 78%, the transmittivity thereof to red light ranges from 26% to 30%, and the transmittivity thereof to green light ranges from 40% to 44.7%, so that when the color filter array is applied to a liquid crystal display panel including a backlight source which is blue light, the majority of the blue light can be transmitted through the color-resist filler made of a quantum dot material without hindering the backlight source from exciting the quantum dot material.

Figure 7:
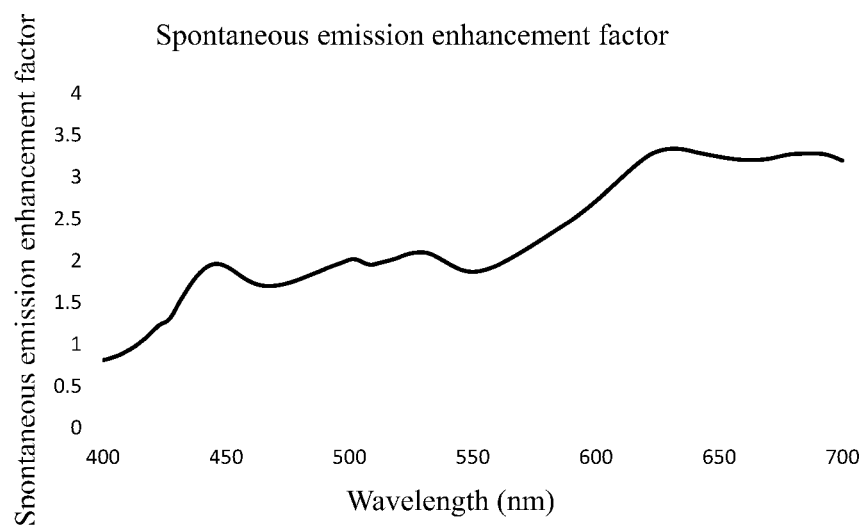
FIG. 7 is a schematic diagram of enhanced spontaneous emission of quantum dots due to localized surface plasmon resonance according to some embodiments of the disclosure.

In a possible implementation, the reflecting layer 21 is a silver film with a thickness ranging from 5 mn to 15 nm, and optionally 10 nm. In some embodiments of the disclosure, the material of the reflecting layer is silver, and the thickness of the silver film ranges from 5 nm to 15 nm. Localized surface plasmon resonance may be incurred to thereby significantly enhance spontaneous emission of quantum dots. When the color filter substrate is applied to a display panel, the light-emission efficiency and the color gamut of the display panel can be improved. FIG. 7 illustrates a schematic diagram of enhanced spontaneous emission of quantum dots due to localized surface plasmon resonance when the silver film is arranged according to some embodiments of the disclosure, where the abscissa is a wavelength of light, and the ordinate is an enhancement factor, where emission power corresponding to a red pixel element is enhanced by a factor of approximately 3.3, and emission power corresponding to a green pixel element is enhanced by a factor of approximately 2.

In a possible implementation, the depth of a groove ranges from 300 nm to 400 nm. It shall be appreciated that the depth of a groove refers to the depth of the groove at the lowermost position thereof in the direction perpendicular to the base substrate.

Figure 8:
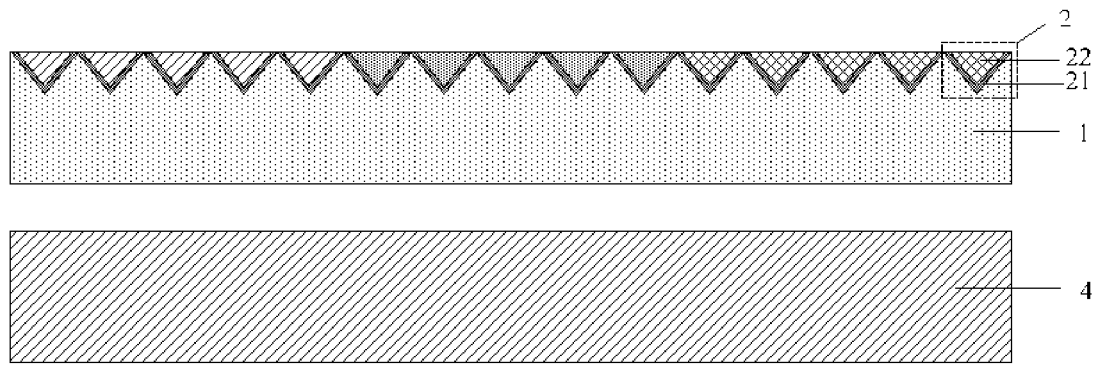
FIG. 8 is a schematic structural diagram of a display device according to some embodiments of the disclosure.

Some embodiments of the disclosure further provide a display device as illustrated in FIG. 8 including an array substrate 4, and the color filter substrate according to some embodiments of the disclosure, where a side provided with the grooves, of the color filter is away from the array substrate. In a particular implementation, the display device can further include a blue backlight source, and the color-resist elements particularly can include red color-resist elements for emitting red light upon being excited by the blue light, green color-resist element for emitting green light upon being excited by the blue light, and blue color-resist elements through which the blue light is transmitted.

Figure 9:
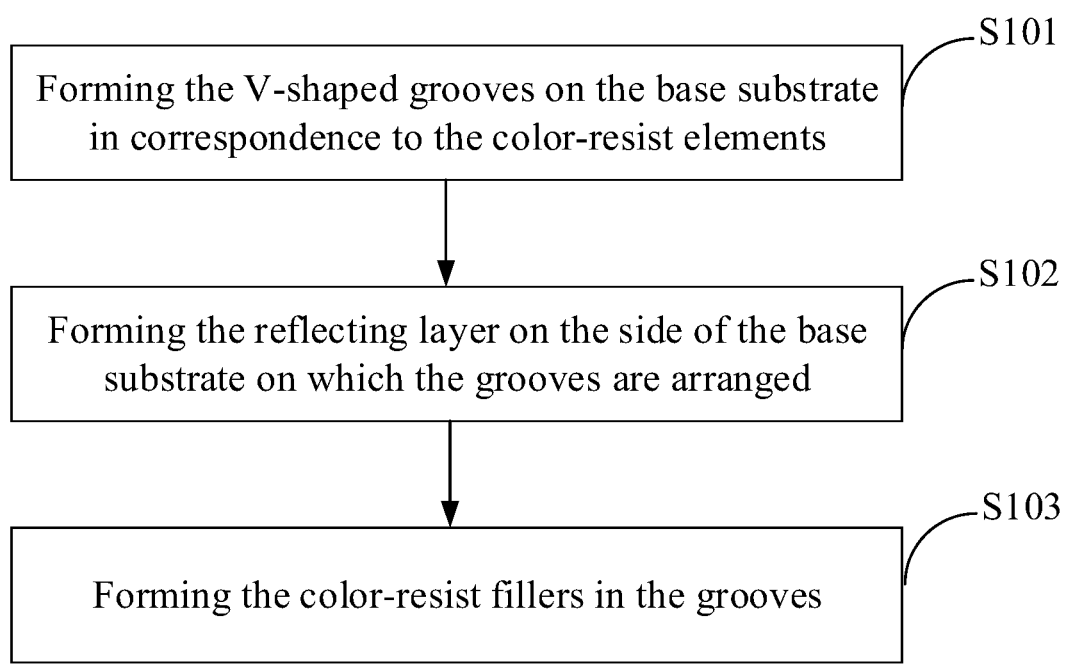
FIG. 9 is a schematic flow chart of fabricating a color filter substrate according to some embodiments of the disclosure.

Some embodiments of the disclosure further provide a method for fabricating the color filter substrate according to some embodiments of the disclosure, and as illustrated in FIG. 9, the fabricating method includes:

the step S101 is to form the V-shaped grooves on the base substrate in correspondence to the color-resist elements;

the step S102 is to form the reflecting layer on the side of the base substrate on which the grooves are arranged, where a thin silver film can be vapor-plated uniformly on the side of the base substrate on which the grooves are arranged, in a vapor-plating process. It shall be appreciated that since the silver film is thin, the side of the base substrate on which the grooves are arranged is still structured with the V-shaped grooves after the silver film is vapor-plated on the side, that is, the overall shape of the base substrate is not changed, so the color-resist fillers can be further filled in the grooves; and the step S103 is to form the color-resist fillers in the grooves.

Advantageous effects of the embodiments of the disclosure are as follows: in the color filter substrate according to some embodiments of the disclosure, the grooves are arranged on the base substrate in correspondence to the respective color-resist elements; the color-resist fillers are filled in the grooves so that a color-resist layer can be formed; the size of the openings of the grooves is increase from the bottom to the top of the grooves, for example, the openings are V-shaped; and the reflecting layer is coated on the inner surfaces of the grooves so that the light emitted by each color-resist element can be emitted to one side of a display face to thereby avoid a color mixture between the adjacent pixel elements so as to improve the color gamut.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A color filter substrate comprising a plurality of color-resist elements, wherein the color filter substrate further comprises: a base substrate, and a groove arranged on the base substrate in correspondence to each of the color-resist elements, wherein a size of an opening of the groove gradually increases from a bottom to a top of the groove, a reflecting layer is coated on an inner surface of the groove, and a color-resist filler corresponding to a color of light emitted by the color-resist element is further filled in the groove above the reflecting layer; wherein a material of the color-resist filler comprises quantum dot particles.

2. The color filter substrate according to claim 1, wherein a plurality of grooves are arranged on the base substrate in correspondence to each of the color-resist elements, and color-resist fillers filled in the plurality of grooves corresponding to a same color-resist element are same.

3. The color filter substrate according to claim 2, wherein the plurality of grooves are arranged in an array, and a section shape of each of the plurality of grooves is an inverted tri-pyramid, quadric-pyramid or cone.

4. The color filter substrate according to claim 2, wherein each of the plurality of grooves is shaped like a strip, and the grooves are arranged in parallel.

5. The color filter substrate according to claim 1, wherein the color-resist elements are arranged in an array, a same row of color-resist elements emits light in same color, and a group of grooves are arranged on the base substrate in correspondence to each row of color-resist elements, wherein each group of grooves comprises a plurality of strip grooves extending in a row direction of corresponding color-resist elements, and color-resist fillers filled in the plurality of strip grooves corresponding to a same row of color-resist elements are same.

6. The color filter substrate according to claim 1, wherein the color-resist elements are arranged in an array, a same column of color-resist elements emits light in same color, and a group of grooves are arranged on the base substrate in correspondence to each column of color-resist elements, wherein each group of grooves comprises a plurality of strip grooves extending in a column direction of corresponding color-resist elements, and color-resist fillers filled in the plurality of strip grooves corresponding to a same column of color-resist elements are same.

7. The color filter substrate according to claim 1, wherein the color-resist elements are arranged in an array, a same row of color-resist elements emits light in same color, and a groove is arranged on the base substrate in correspondence to a same row of color-resist elements.

8. The color filter substrate according to claim 1, wherein a same column of color-resist elements emits light in a same color, and a groove is arranged on the base substrate in correspondence to a same column of color-resist elements.

9. The color filter substrate according to claim 8, wherein the reflecting layer is a silver film with a thickness ranging from 5 nm to 15 nm.

10. The color filter substrate according to claim 1, wherein a transmittivity of the reflecting layer to blue light ranges from 69% to 78%.

11. A display device, comprising an array substrate, and the color filter substrate according to claim 1, wherein a side provided with the groove, of the color filter is away from the array substrate.

12. The display device according to claim 11, wherein a plurality of grooves are arranged on the base substrate in correspondence to each of the color-resist elements, and color-resist fillers filled in the plurality of grooves corresponding to a same color-resist element are same.

13. The display device according to claim 12, wherein the plurality of grooves are arranged in an array, and a section shape of each of the plurality of grooves is an inverted tri-pyramid, quadric-pyramid or cone.

14. The display device according to claim 12, wherein each of the plurality of grooves is shaped like a strip, and the grooves are arranged in parallel.

15. The display device according to claim 11, wherein the color-resist elements are arranged in an array, a same row of color-resist elements emits light in same color, and a group of grooves are arranged on the base substrate in correspondence to each row of color-resist elements, wherein each group of grooves comprises a plurality of strip grooves extending in a row direction of corresponding color-resist elements, and color-resist fillers filled in the plurality of strip grooves corresponding to a same row of color-resist elements are same.

16. The display device according to claim 11, wherein the color-resist elements are arranged in an array, a same column of color-resist elements emits light in same color, and a group of grooves are arranged on the base substrate in correspondence to each column of color-resist elements, wherein each group of grooves comprises a plurality of strip grooves extending in a column direction of corresponding color-resist elements, and color-resist fillers filled in the plurality of strip grooves corresponding to a same column of color-resist elements are same.

17. The display device according to claim 11, wherein the color-resist elements are arranged in an array, a same row of color-resist elements emits light in same color, and a groove is arranged on the base substrate in correspondence to the same row of color-resist elements.

18. The display device according to claim 11, wherein a same column of color-resist elements emits light in the same color, and a groove is arranged on the base substrate in correspondence to the same column of color-resist elements.

* * * * *